(12) United States Patent
Shimizu et al.

(10) Patent No.: US 9,123,835 B2
(45) Date of Patent: Sep. 1, 2015

(54) CONNECTED STRUCTURE AND METHOD FOR MANUFACTURE THEREOF (75) Inventors: Takehiro Shimizu, Tokyo (JP); Kaoru Okaniwa, Tsukuba (JP); Naoki Fukushima, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1338 days.

(21) Appl. No.: 12/445,227

(22) PCT Filed: Apr. 27, 2007

(86) PCT No.: PCT/JP2007/059210
§ 371 (c)(1),
(2), (4) Date: Feb. 26, 2010

(87) PCT Pub. No.: WO2008/044357
PCT Pub. Date: Apr. 17, 2008

(65) Prior Publication Data
US 2010/0147355 A1    Jun. 17, 2010

(30) Foreign Application Priority Data
Oct. 10, 2006   (JP) ................ P2006-276785

(51) Int. Cl.
*H01L 31/042*  (2014.01)
*H01L 31/02*   (2006.01)
(Continued)

(52) U.S. Cl.
CPC ...... *H01L 31/02008* (2013.01); *H01L 31/0512* (2013.01); *H01L 24/28* (2013.01); *H01L 24/83* (2013.01); *H01L 2224/294* (2013.01); *H01L 2224/2929* (2013.01);
(Continued)

(58) Field of Classification Search
CPC .... H01L 31/02008; H01L 31/05; H01L 31/18
USPC ........................................... 136/244
See application file for complete search history.

(56) References Cited

U.S. PATENT DOCUMENTS 5,001,302 A    3/1991  Atsumi
2005/0115602 A1*  6/2005  Senta et al. ............ 136/250
(Continued)

FOREIGN PATENT DOCUMENTS

JP    63-50283    * 12/1988 ............. C09J 7/02
JP    7-147424     6/1995
(Continued)

OTHER PUBLICATIONS

Fujii, JP 2006-206843 A, Machine Translation, Aug. 2006.*
(Continued)

*Primary Examiner* — Devina Pillay
(74) *Attorney, Agent, or Firm* — Griffin & Szipl, P.C.

(57) ABSTRACT

A method for electrically connecting a surface electrode of a solar battery cell and a wiring member via a conductive adhesive film, wherein the conductive adhesive film contains an insulating adhesive and conductive particles, and wherein when the ten point height of roughness profile and maximum height of the surface of the surface electrode in contact with the conductive adhesive film are Rz (μm) and Ry (μm) respectively, the average particle diameter r (μm) of the conductive particles is equal to or greater than the ten point height of roughness profile Rz, and the thickness t (μm) of the conductive adhesive film is equal to or greater than the maximum height Ry.

12 Claims, 3 Drawing Sheets (51) Int. Cl.
*H01L 31/05* (2014.01)
*H01L 23/00* (2006.01)

(52) U.S. Cl.
CPC ............... *H01L 2224/29339* (2013.01); *H01L 2224/29344* (2013.01); *H01L 2224/29347* (2013.01); *H01L 2224/29355* (2013.01); *H01L 2224/83192* (2013.01); *H01L 2224/83851* (2013.01); *H01L 2224/83855* (2013.01); *H01L 2924/0102* (2013.01); *H01L 2924/01004* (2013.01); *H01L 2924/01012* (2013.01); *H01L 2924/01078* (2013.01); *H01L 2924/01079* (2013.01); *H01L 2924/07802* (2013.01); *H01L 2924/1461* (2013.01); *Y02E 10/50* (2013.01); *Y10T 29/49204* (2015.01); *Y10T 428/24372* (2015.01)

(56) References Cited

U.S. PATENT DOCUMENTS

| | | | |
|---|---|---|---|
| 2005/0181220 | A1 | 8/2005 | Kobata et al. |
| 2005/0199279 | A1* | 9/2005 | Yoshimine et al. ........... 136/251 |
| 2006/0033213 | A1 | 2/2006 | Yim et al. |
| 2006/0159930 | A1 | 7/2006 | Ishizuka et al. |
| 2007/0095387 | A1* | 5/2007 | Fujii et al. ..................... 136/251 |

FOREIGN PATENT DOCUMENTS

| | | | | |
|---|---|---|---|---|
| JP | 3448924 | | 6/1995 | |
| JP | 07-221422 | | 8/1995 | |
| JP | 08-236796 | | 9/1996 | |
| JP | 8-332696 | | 12/1996 | |
| JP | 11-61060 | | 3/1999 | |
| JP | 2000-286436 | | 10/2000 | |
| JP | 2001-127103 | * | 5/2001 | .............. H01L 21/60 |
| JP | 2001-127103 | A | 5/2001 | |
| JP | 2001-345465 | | 12/2001 | |
| JP | 2001-357897 | | 12/2001 | |
| JP | 2003-82318 | | 3/2003 | |
| JP | 2003-257243 | | 9/2003 | |
| JP | 2004-204256 | | 7/2004 | |
| JP | 2004-247402 | A | 9/2004 | |
| JP | 2005-50780 | | 2/2005 | |
| JP | 2005-101519 | | 4/2005 | |
| JP | 2005-243935 | | 9/2005 | |
| JP | 2005-252062 | | 9/2005 | |
| JP | 2006-206843 | | 5/2006 | |
| JP | 2006-183020 | | 7/2006 | |
| TW | 392257 | | 6/2000 | |
| TW | 254322 | | 5/2006 | |

OTHER PUBLICATIONS

JP2001-127103, Machine Translation, Basho, May 2001.*
JP63-50283, Human Translation, Tsukakoshi, Dec. 1988.*
International Search Report issued in corresponding application No. PCT/JP2007/059210, completed Jul. 20, 2007 and mailed Jul. 31, 2007.
English translation of the International Preliminary Report on Patentability mailed Apr. 30, 2009.
Notification of Information Provision issued on Feb. 14, 2011 co-pending related Japanese application 2006-276785 and English translation thereof.
Office Action issued in a counterpart Taiwanese application 096115751 dated Aug. 20, 2010 (no English translation available).
Office Action issued in a counterpart Japanese application P2006-276785 on Dec. 13, 2011 (no translation available; submitted for certification purposes).
English Abstract from esp@cenet corresponding to JP 2006-206843, dated Apr. 2, 2009 (Exhibit A).
Ray Marsili, Multivariate Analysis Imprives Product Design Efficiency, at http://www.foodproductdesign.com/articles/1996/09/multivariate-analysis-improves-product-design-eff.aspx (Sep. 1, 1996), (Exhibit B).
"General Liner Models (GLM)," at http://www.statsoft.com/textbook/general-liear-models/ (downloaded Aug. 10, 2012), (Exhibit C).
Ankur Srivastava, Methodologies for Predictability Optimization (2002)(Ph.D dissertation, University of California Los Angeles), (Exhibit D).
Extended European Search Report issued in a counterpart European application 07742645.0, completed Mar. 29, 2012 and mailed Apr. 5, 2012.
Office Action issued in counterpart Japanese application P2010-277327, mailed on May 7, 2013 (no translation available, submitted for certification).

* cited by examiner

CONNECTED STRUCTURE AND METHOD FOR MANUFACTURE THEREOF

This is a National Phase application in the United States of International Patent Application No. PCT/JP2007/059210 filed Apr. 27, 2007, which claims priority on Japanese Patent Application No. P2006-276785, filed Oct. 10, 2006 and is related to Japanese Patent Application No. P2005-326050, filed Nov. 10, 2005. The entire disclosures of the above patent applications are hereby incorporated by reference.

TECHNICAL FIELD

The present invention relates to a method for connecting a surface electrode of a solar battery cell and a wiring member, a conductive adhesive film, and a solar battery module.

BACKGROUND ART

A solar battery module has a structure in which a plurality of solar battery cells are connected in series and/or in parallel via wiring members electrically connected to the surface electrodes of the solar battery cells. In fabricating this solar battery module, solder has been conventionally used for the connection of the surface electrode of the solar battery cell and the wiring member (for example, see Patent Documents 1 and 2). Solder is widely used because it has excellent connection reliability, such as conduction and adhesion strength, and is inexpensive and versatile.

On the other hand, in terms of environmental protection and the like, methods for connecting wiring without using solder, in a solar battery, are proposed. For example, Patent Documents 3 to 6 disclose methods for connecting wirings by a conductive adhesive, such as a conductive paste.

Patent Document 1: Japanese Patent Application Laid-Open No. 2004-204256
Patent Document 2: Japanese Patent Application Laid-Open No. 2005-050780
Patent Document 3: Japanese Patent Application Laid-Open No. 2000-286436
Patent Document 4: Japanese Patent Application Laid-Open No. 2001-357897
Patent Document 5: Japanese Patent No. 3448924
Patent Document 6: Japanese Patent Application Laid-Open No. 2005-101519

DISCLOSURE OF THE INVENTION

Problems to be Solved by the Invention

However, in the connection methods using solder described in Patent Documents 1 and 2, degradation in the properties of the solar battery occurs easily. This is because the members of the semiconductor structure and the like in the solar battery are heated in melting solder having a melting point of about 230 to 260° C., and/or the volume shrinkage of the solder affects the semiconductor structure and the like. Also, with the connection of wiring by solder, it is difficult to control the distance between the electrode and the wiring, so that it is difficult to obtain sufficient dimensional accuracy in packaging. Low dimensional accuracy also leads to a decrease in the yield of the product due to packaging.

Further, it has been made clear by the study of the present inventors that when the connection of the surface electrode of the solar battery cell and the wiring member is performed using the conductive adhesive, as described in Patent Documents 3 to 5, the connection reliability in the connection between the wirings decreases substantially under high temperature and high humidity conditions, with the lapse of time.

Also, when the connection of the surface electrode of the solar battery cell and the wiring member is performed using the conductive film, as described in Patent Document 6, adhesion is possible at low temperature, so that an adverse effect on the solar battery cell, which occurs when solder is used, can be suppressed. However, in the connection method described in Patent Document 6, the effect of the surface state of an adherend is not considered, and the connection reliability is not necessarily sufficient.

The present invention has been made in view of the above circumstances, and it is an object of the present invention to provide a method for connecting a surface electrode of a solar battery cell and a wiring member that uses a connection member, which is an alternative to solder, and provides sufficiently excellent connection reliability, a conductive adhesive film, and a solar battery module.

Means for Solving the Problems

In order to solve the above problems, the present invention provides a method for electrically connecting a surface electrode of a solar battery cell and a wiring member via a conductive adhesive film, wherein the conductive adhesive film contains an insulating adhesive and conductive particles, and wherein when the ten point height of roughness profile and maximum height of the surface of the surface electrode in contact with the conductive adhesive film are Rz (μm) and Ry (μm) respectively, the average particle diameter r (μm) of the conductive particles is equal to or greater than the ten point height of roughness profile Rz, and the thickness t (μm) of the conductive adhesive film is equal to or greater than the maximum height Ry.

Also, the present invention provides a conductive adhesive film used for electrically connecting a surface electrode of a solar battery cell and a wiring member, containing an insulating adhesive and conductive particles, wherein when the ten point height of roughness profile and maximum height of the surface of the surface electrode in contact with the conductive adhesive film are Rz (μm) and Ry (μm) respectively, the average particle diameter r (μm) of the conductive particles is equal to or greater than the ten point height of roughness profile Rz, and the thickness t (μm) of the conductive adhesive film is equal to or greater than the maximum height Ry.

One of the features of the connection method of the present invention described above is that the average particle diameter r of the conductive particles included in the conductive adhesive film is equal to or greater than the ten point height of roughness profile Rz in the surface of the surface electrode of the solar battery cell in contact with the conductive adhesive film. Thus, the conductive particles included in the conductive adhesive film can, sufficiently reliably, electrically connect the surface electrode of the solar battery cell and the wiring member.

Also, another one of the features of the connection method of the present invention is that the thickness t of the conductive adhesive film is equal to or greater than the maximum height Ry in the surface of the surface electrode of the solar battery cell in contact with the conductive adhesive film. Thus, the conductive adhesive film can sufficiently strongly adhere the surface electrode of the solar battery cell and the wiring member to each other.

With complex effects of these electrical connectivity and adhesiveness, the connection method of the present invention can sufficiently enhance the connection reliability.

Also, in the connection method of the present invention, it is not necessary to use solder to connect the surface electrode of the solar battery and the wiring member, so that it is possible to sufficiently reduce the effects of the heating of the members, and the volume shrinkage of the conductive adhesive film.

Here, the ten point height of roughness profile Rz and the maximum height Ry are values derived according to JIS-B0604-1994 and are derived by observation by an ultra-depth shape measurement microscope, and calculation by image measurement and analysis software. Also, the average particle diameter r of the conductive particles is a value obtained by observing the conductive particles by a scanning electron microscope (SEM), randomly extracting 20 conductive particles, measuring the particle diameters of the particles, and then calculating the arithmetic mean of the particle diameters. Also, the thickness t of the conductive adhesive film is a value measured by a micrometer.

Also, the elastic modulus of the conductive adhesive film is a value measured as follows. First, an insulating adhesive is applied on a releasable substrate film to form a coating film of the insulating adhesive. Then, the coating film is heated at 170° C. for 20 minutes by an oven. Subsequently, the substrate film is released to obtain a film of the heated product of the coating film. The film is cut into a strip shape having a width of 5 mm and a length of 35 mm to obtain a specimen. For the specimen, the storage modulus at 25° C. is measured using a dynamic viscoelasticity measurement apparatus, and the value of the storage modulus is defined as the elastic modulus of the conductive adhesive film.

In the present invention, the wiring member of the solar battery cell is preferably a film-like conductive member. Thus, the distance between the surface electrode of the solar battery cell and the wiring member during connection is easily controlled, so that the dimensional accuracy in packaging is further improved.

In the present invention, the film-like conductive member preferably includes as the main component one or more metals selected from the group consisting of Cu, Ag, Au, Fe, Ni, Pb, Zn, Co, Ti, and Mg. By including these metals, the conductivity of the wiring member is further improved, thereby leading to a further improvement in connection reliability.

In the present invention, the surface electrode of the solar battery cell may be an electrode provided on a surface of one or more wafers selected from the group consisting of a monocrystalline silicon wafer, a polycrystalline silicon wafer, an amorphous silicon wafer, and a compound semiconductor wafer. By using such a member as the surface electrode, the above action and effect of the present invention are further effectively exhibited.

Also, in conventional solar battery cells, the surface of the electrode tends to be coarser than those of other electronic device members, so that according to the present invention, the connection reliability can be further significantly improved. As a result, a high value of fill factor (hereinafter expressed as "F. F.") can be maintained for a long period.

Effect of the Invention

The present invention can provide a method for connecting a surface electrode of a solar battery cell and a wiring member that uses a connection member, which is an alternative to solder, and provides sufficiently excellent connection reliability.

EXPLANATION OF SYMBOLS

1: conductive particle, 2: adhesive component, 3: surface electrode, 3a: bus electrode (surface electrode), 3b: bus electrode (surface electrode), 4: wiring member, 6: semiconductor wafer, 7: grid electrode, 8: back surface electrode, 10: conductive adhesive film, 100: solar battery module, 200: connection structure.

BEST MODES FOR CARRYING OUT THE INVENTION

Preferred embodiments of the present invention will be described below in detail, with reference to the drawings as required. In the drawings, like numerals refer to like elements, and redundant description is omitted. Also, positional relationship, such as top, bottom, left, and right, is based on the positional relationship shown in the drawing, unless otherwise specified. Further, the dimensional ratio in the drawings is not limited to the ratio shown.

Figure 1:
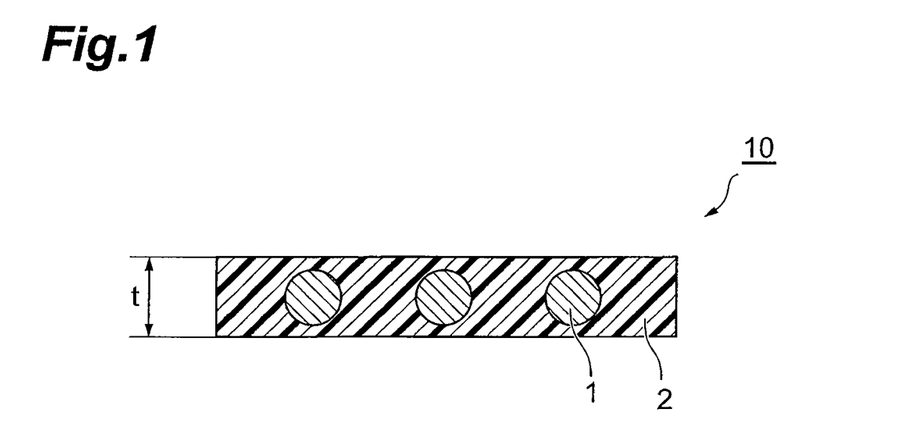
FIG. 1 is a schematic cross-sectional view showing a part of a conductive adhesive film according to an embodiment.

FIG. 1 is a schematic cross-sectional view showing one embodiment of the conductive adhesive film of the present invention. As shown in FIG. 1, a conductive adhesive film 10 in this embodiment contains at least conductive particles 1 and an adhesive component 2.

Figure 2:
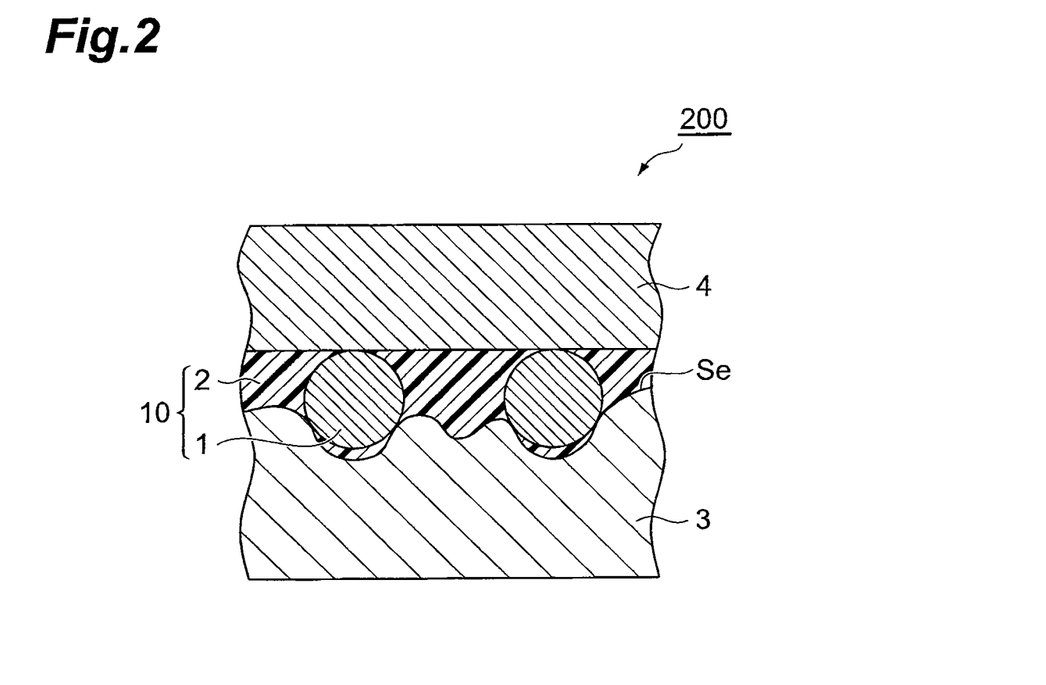
FIG. 2 is a schematic cross-sectional view showing a part of a connection structure according to an embodiment.

Also, FIG. 2 is a schematic cross-sectional view showing a part of a connection structure obtained by a connection method for connecting a surface electrode of a solar battery cell and a wiring member, using the conductive adhesive film of the present invention. In this connection structure 200, a surface electrode 3 of a solar battery cell, the conductive adhesive film 10, and a wiring member 4 are laminated in this order.

The conductive adhesive film 10 in this embodiment is for connecting the surface electrode 3 of the solar battery cell and the wiring member (wiring wire) 4 for connecting the solar battery cells in series and/or in parallel. An electrode (surface electrode) for taking electricity is formed on the front surface and back surface of the solar battery cell.

Here, the surface electrode 3 includes those of publicly known materials that can provide electrical conduction. Specific examples of the materials include, for example, a general glass paste containing silver, a silver paste, a gold paste, a carbon paste, a nickel paste, and an aluminum paste, in which various conductive particles are dispersed in adhesive resins, and, ITO formed by baking or vapor deposition, and the like. Among these, an electrode of a glass paste containing silver is preferably used in terms of excellent heat resistance, conductivity, and stability, and low cost.

In most of the solar battery cells, an Ag electrode and an Al electrode are respectively provided as the surface electrode 3 by applying a silver paste and an aluminum paste on a substrate of at least one or more of monocrystalline, polycrystalline, and amorphous Si, by screen printing or the like, and drying and baking them as required.

The conductive adhesive film 10 includes at least the adhesive component 2 and the conductive particles 1 dispersed in the adhesive component 2. The adhesive component 2 is not particularly limited as long as it exhibits adhesiveness. However, in terms of further enhancing connection reliability, the adhesive component 2 is preferably a composition containing a thermosetting resin.

The thermosetting resin may be a publicly known one and includes, for example, epoxy resins, phenoxy resins, acrylic resins, polyimide resins, polyamide resins, and polycarbonate resins. One of these thermosetting resins is used alone, or two or more of these thermosetting resins are used in combination. Among these, one or more thermosetting resins selected from the group consisting of epoxy resins, phenoxy resins, and acrylic resins are preferred, in terms of further improving connection reliability.

The adhesive component 2 according to this embodiment may be a composition containing a publicly known curing agent and curing accelerator as optional components, in addition to the thermosetting resin. Also, this adhesive component 2 may contain a modifying material, such as a silane-based coupling agent, a titanate-based coupling agent, and an aluminate-based coupling agent, to improve adhesiveness and wettability to the surface electrode 3 and the wiring member 4, and may contain a dispersant, such as calcium phosphate and calcium carbonate, to improve the uniform dispersibility of the conductive particles 1. Further, this adhesive component 2 may contain a rubber component, such as an acrylic rubber, a silicon rubber, and urethane, to control elastic modulus and tackiness, and may contain a chelate material or the like to suppress the migration of silver and copper included in the surface electrode 3, the wiring member 4, and the conductive particles 1.

The elastic modulus of the conductive adhesive film 10 is preferably 0.5 GPa to 4.0 GPa, and more preferably 0.9 GPa to 3.5 GPa, in terms of relaxing the warp of the surface electrode 3 after adhesion, and compressive stress during adhesion. When the elastic modulus of the conductive adhesive film 10 is 0.5 GPa or more, a decrease in adhesive strength due to its poor film strength can be further prevented. When the elastic modulus of the conductive adhesive film 10 is 4.0 GPa or less, it has excellent stress relaxation properties, and the occurrence of the warp and failure of the surface electrode 3 can be further suppressed.

The elastic modulus of the conductive adhesive film 10 is measured as follows. First, an adhesive component, which is a precursor for the conductive adhesive film 10, is applied on a surface of a polyethylene terephthalate film treated with silicone, by a manipulator (manufactured by YOSHIMISU) to form a coating film. Then, the coating film is dried at 170° C. for 20 minutes, using an oven. Subsequently, the polyethylene terephthalate film is released to obtain the conductive adhesive film 10 having a film thickness of 25 μm or 35 μm. The obtained conductive adhesive film 10 is cut into a strip shape having a width of 5 mm and a length of 35 mm. The storage modulus at 25° C. is measured by a dynamic viscoelasticity measurement apparatus (manufactured by Rheometric Scientific, trade name: "SOLIDS ANALYZER," distance between chucks: 2 cm), and the measured storage modulus is defined as the elastic modulus of the conductive adhesive film 10.

The material of the conductive particles 1 is not particularly limited as long as the conductive particles 1 have conductivity and are solid in environments for manufacturing and using the connection structure 200. The conductive particles 1 include, for example, metal particles, such as gold particles, silver particles, copper particles, and nickel particles, or conductive particles formed by covering the surface of conductive or insulating core particles with a conductive layer such as a metal layer, such as gold-plated particles, copper-plated particles, and nickel-plated particles.

Among these, particles formed by covering the surface of core particles with a conductive layer are preferred, and those in which the core particle is a plastic particle and the conductive layer is metal plating are more preferred, in terms of relaxing the compressive stress of the conductive particles during connection and improving connection reliability. In other words, conductive particles formed by covering the surface of plastic particles with a metal layer are preferred because the followability of the particles themselves is high with respect to fluctuations, such as vibration and expansion, after connection.

The mixing amount of the conductive particles 1 dispersed in the conductive adhesive film 10 is preferably 0.5 to 20% by volume, and more preferably 2.0 to 12% by volume, based on the total volume of the conductive adhesive film 10, in terms of connection reliability after the adhesive component 2 is cured. If the mixing amount of the conductive particles 1 is less than 0.5% by volume, physical contacts with the surface electrode 3 tend to decrease, and yet, the connection resistance of the connection structure 200 in a reliability test atmosphere (85° C. and 85% RH) tends to decrease. Also, if the mixing amount of the conductive particles 1 is more than 20% by volume, the relative amount of the adhesive component 2 is reduced, so that the adhesive strength of the connection structure 200 tends to decrease in a reliability test atmosphere (85° C. and 85% RH).

Next, the relationship between the surface electrode 3 and the conductive adhesive film 10 is described in detail. When the average particle diameter of the conductive particles 1 is r (μm), the average particle diameter r is equal to or greater than the ten point height of roughness profile Rz (μm) of the surface Se of the surface electrode 3. Also, when the film thickness of the conductive adhesive film 10 is t (μm, see FIG. 1), the film thickness t is equal to or greater than the maximum height Ry (μm) of the surface Se of the surface electrode 3.

The surface Se of the surface electrode 3 may have unevenness generally having a height difference of 3 to 30 μm, depending on the application. Particularly, the surface electrode 3, when provided in a solar battery cell, tends to be rough, with the above unevenness having a height difference of 8 to 18 μm. As a result of diligent study, the present inventors have found that due to this unevenness, the connection reliability is not sufficient in conventional solar batteries.

As a result of further study, the present inventors have made it clear that when the conductive adhesive film 10 in which the conductive particles 1 are dispersed in the adhesive component 2 is used as a layer for connecting the surface electrode 3 and the wiring member 4, the connection reliability can be improved. The inventors have found out that the relationship between the surface roughness of the surface Se of the surface electrode 3, and the average particle diameter of the conductive particles 1 and the film thickness of the conductive adhesive film 10 affects the connection reliability. Specifically, the inventors have found that the correlation between the average particle diameter r of the conductive particles 1 and the ten point height of roughness profile Rz of the surface Se of the surface electrode 3, and the correlation between the film thickness t of the conductive adhesive film 10 and the maximum height Ry of the surface Se of the surface electrode 3 affect the connection reliability. It is considered that to improve the connection reliability, the average roughness of portions having large height differences in the surface Se of the surface electrode 3 is the factor for determining the average particle diameter r of the conductive particles 1, and the roughness of a portion having the largest height difference in the surface Se of the surface electrode 3 is the factor for determining the film thickness t of the conductive adhesive film 10.

In other words, if the average particle diameter r of the conductive particles 1 is less than the ten point height of roughness profile Rz of the surface Se of the surface electrode 3, the conductive particles 1 are buried in recesses in the surface Se and do not easily contribute to electrical connection between the surface electrode 3 and the wiring member 4 described in detail later. As a result, the connection reliability in the connection structure 200 is not sufficient. Also, if the film thickness t of the conductive adhesive film 10 is thinner than the maximum height Ry of the surface Se of the surface electrode 3, it is difficult for the conductive adhesive film 10 to fill between the surface electrode 3 and the wiring member 4 without clearance, so that the adhesiveness between the surface electrode 3 and the wiring member 4 is not sufficient. As a result, the connection reliability in the connection structure 200 is not sufficient.

The average particle diameter r of the conductive particles 1 is preferably greater than the ten point height of roughness profile Rz of the surface Se of the surface electrode 3 by 1 µm or more, more preferably 3 µm or more, and further preferably 5 µm or more. Thus, poor connection between the surface electrode 3 and the wiring member 4 can be more sufficiently suppressed. Also, the upper limit of the difference between the above average particle diameter r and the above ten point height of roughness profile Rz is preferably Rz µm, and more preferably ⅔ Rz µm. When the difference between these is Rz µm or less, particularly ⅔ Rz µm or less, the conductive particles 1 are physically stably located in the recesses, so that the advantage of decreasing connection resistance is obtained.

The average particle diameter r of the conductive particles 1 is preferably 3 to 30 µm, and more preferably 8 to 25 µm, in terms of an improvement in uniform dispersibility in the adhesive component 2.

The film thickness t of the conductive adhesive film 10 is preferably greater than the maximum height Ry of the surface Se of the surface electrode 3 by 1 µm or more, more preferably 3 µm or more, and particularly preferably 5 µm or more. Thus, the filling of the conductive adhesive film 10 is further sufficient, so that poor connection can be more sufficiently suppressed. Also, the upper limit of the difference between the above film thickness t and the above maximum height Ry is preferably 20 µm, and more preferably 10 µm. When the difference between these is 20 µm or less, particularly 10 µm or less, the flowability of the resin in the adhesive component 2 during heating and pressure bonding, and the curability of the resin are further improved, so that the advantage of an increase in connection strength is obtained.

Preferably, the wiring member 4 is film-like, that is, its cross section is rectangular. Thus, the distance between the wiring member 4 and the surface electrode 3 can be easily controlled, so that the dimensional accuracy in packaging is improved.

The wiring member 4 is not particularly limited as long as it includes a metal as the main component. The metal that is the material of the wiring member 4 includes, for example, gold, silver, copper, iron, stainless steel, alloy 42, and solder-plated copper. In terms of further improving conductivity, the wiring member 4 more preferably includes one or more metals selected from the group consisting of Cu, Ag, Au, Fe, Ni, Pb, Zn, Co, Ti, and Mg. Also, in terms of further improving flexibility to enhance the above dimensional accuracy, the wiring member 4 is preferably a metal plating layer or an electrodeposited metal layer provided on the surface of an insulating film (not shown). However, the wiring member 4 may be a metal foil, depending on the application.

The material of the above insulating film is not particularly limited as long as it exhibits insulation. However, in terms of further improving flexibility to enhance the above dimensional accuracy, the material of the above insulating film is preferably one including a resin as the main component. This resin includes, for example, polyimide resins, glass-epoxy resins, bismaleimide-triazine resins, and polyester resins.

Next, a connection method according to a preferred embodiment, that is, a method for manufacturing the connection structure 200, is described. This connection method has the following first step, second step, third step, and fourth step.

In the first step, a first laminate obtained by forming the surface electrode 3 on a substrate, such as a silicon wafer, is prepared.

In the second step, the conductive adhesive film 10 is formed on a surface of the wiring member 4 formed on an insulating film to obtain a second laminate. The conductive adhesive film 10 may be obtained through the step of applying a pasty adhesive component in which the conductive particles 1 are dispersed (hereinafter, a mixture of the conductive particles and the pasty adhesive component is also referred to as a "pasty conductive adhesive") on a surface of the wiring member 2 and then volatilizing the solvent and the like to form the pasty conductive adhesive like a film. Alternatively, the conductive adhesive film 10 may be obtained through the step of previously volatilizing the solvent and the like from the pasty conductive adhesive to shape it like a film, and then placing it on a surface of the wiring member 4.

Among these, the latter is preferred in terms of the dimensional accuracy of the film thickness of the conductive adhesive film 10, and/or pressure distribution in pressure bonding the conductive adhesive film 10 in the fourth step described later. In this case, preferably, after the conductive adhesive film 10 is placed on the surface of the wiring member 4, they are pressurized in the direction of lamination to be temporarily pressure bonded.

The pasty adhesive component is obtained from a composition including the above-described thermosetting resin and other optional components, and when it is liquid at ordinary temperature (25° C.), it can be used as it is. When the above composition is solid at room temperature, it may be turned into a paste by heating or using a solvent, in addition to being turned into a paste. The solvent that can be used is not particularly limited as long as it does not react with the above-described composition and exhibits sufficient solubility.

Also, when the pasty conductive adhesive is previously shaped like a film, it can be obtained by applying the pasty conductive adhesive on a releasable substrate, such as a fluororesin film, a polyethylene terephthalate film, and release paper, or impregnating a substrate, such as a nonwoven fabric, with the above adhesive and placing the substrate on a releasable substrate, and then removing the solvent and the like. When the pasty conductive adhesive is previously shaped like a film in this manner, it has excellent handling properties and is further convenient. Also, in this case, the releasable substrate is released and removed immediately before, or after, the conductive adhesive film 10 is placed on the surface of the wiring member 4.

The pasty conductive adhesive is applied using an applicator, a roll coater, a comma coater, a knife coater, a doctor blade flow coater, an enclosed coater, a die coater, a lip coater, or the like. At this time, the film thickness t of the conductive adhesive film 10 can be controlled by gap adjustment in the applicator or the lip coater. Also, the film thickness t of the conductive adhesive film 10 can also be controlled by adjusting the amount of nonvolatile portions, such as the thermosetting resin, included in the pasty conductive adhesive.

In the third step, a third laminate is obtained in which the first laminate and the second laminate are further laminated so that the surface Se of the surface electrode 3 in the first laminate and the surface of the conductive adhesive film 10 in the second laminate are in contact with each other. At this time, after the first laminate and the second laminate are aligned and laminated, to fix the position, they may be pressurized in the direction of lamination to be temporarily pressure bonded.

In the fourth step, the third laminate is heated and pressurized in the direction of lamination to obtain the connection structure 200 in which at least the surface electrode 3, the conductive adhesive film 10, and the wiring member 4 are laminated in this order. By this fourth step, the surface electrode 3 and the wiring member 4 are adhered to each other by the conductive adhesive film 10, and electrical connection between them is ensured via the conductive adhesive film 10.

The conditions of heating temperature and pressurization pressure are not particularly limited as long as they are in the range that the above electrical connection can be ensured and that the surface electrode 3 and the wiring member 4 are adhered to each other by the conductive adhesive film 10. Various conditions of the pressurization and heating are appropriately selected according to the application for use, the components in the adhesive component, and the materials of the connection structure 200. For example, the heating temperature should be temperature at which the thermosetting resin is cured. Also, the pressurization pressure should be in the range that the surface electrode 3 and the conductive adhesive film 10 are sufficiently closely adhered to each other and that the surface electrode 3, the wiring member 4, and the like are not damaged. Further, the heating and pressurization time should be time such that excessive heat is not propagated to the surface electrode 3, the wiring member 4, and the like to damage or alter the materials. Specifically, conditions, under which the temperature that the conductive adhesive film 10 reaches 150° C. to 180° C. for 15 seconds to 20 seconds under a pressurization condition of 1 MPa to 3 MPa, are preferred in terms of improvements in electrical connection and adhesion.

In the thus obtained connection structure 200, the conductive particles 1 dispersed in the conductive adhesive film 10 make the electrical connection between the surface electrode 3 and the wiring member 4 sufficient. Further, the conductive adhesive film 10 adheres the surface electrode 3 and the wiring member 4 to each other with sufficient adhesive strength. As a result of these, the connection structure 200 has sufficiently excellent connection reliability. Also, solder need not be used to ensure electrical connection, so that degradation in the properties of the connection structure 200 is sufficiently suppressed, and a decrease in the yield of the product due to packaging can also be prevented.

The conductive adhesive film 10 in this embodiment can be most preferably used for a solar battery cell as described above. A solar battery is used as a solar battery module including external terminals in which a plurality of solar battery cells are connected in series and/or in parallel, and sandwiched between tempered glass or the like for environment resistance, with the gap filled with a resin having transparency. The conductive adhesive film 10 in this embodiment is preferably used for an application for connecting a wiring member for connecting a plurality of solar battery cells in series and/or in parallel, and a surface electrode of the solar battery cell.

A solar battery module in this embodiment has a structure in which a plurality of solar battery cells having surface electrodes are connected via wiring members electrically connected to the surface electrodes, as described above, and in the solar battery module, the surface electrode and the wiring member are connected by the conductive adhesive film in this embodiment.

Figure 3:
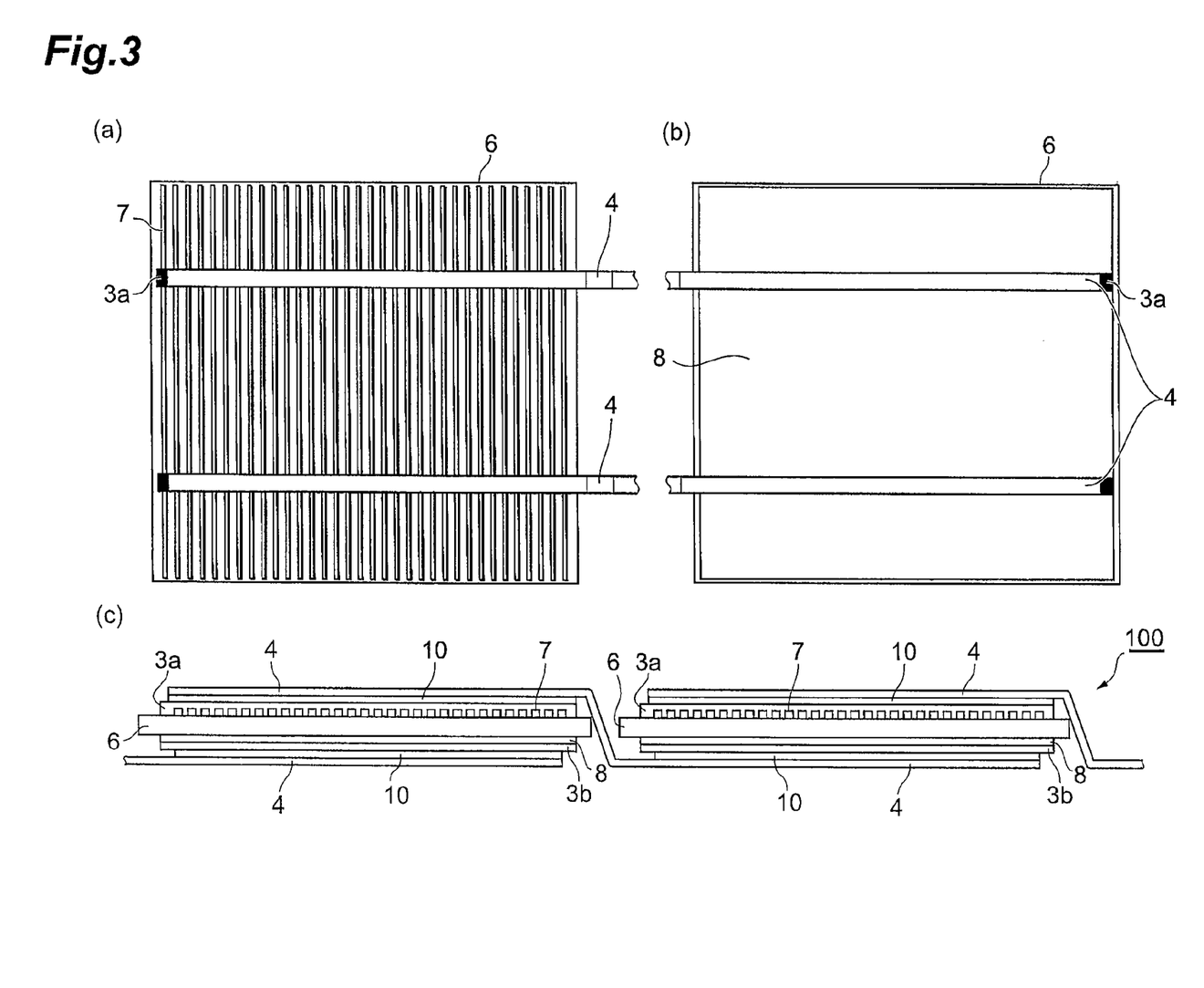
FIG. 3 is a schematic view showing the main part of a solar battery module according to an embodiment.

Here, FIG. 3 is a schematic view showing the main part of the solar battery module in this embodiment and shows a schematic of a structure in which a plurality of solar battery cells are connected to each other by wiring. FIG. 3(a) shows the front surface side of the solar battery module, FIG. 3(b) shows the back surface side, and FIG. 3(c) shows a side surface side.

As shown in FIGS. 3(a) to 3(c), in a solar battery module 100, a plurality of solar battery cells, in which a grid electrode 7 and bus electrodes (surface electrodes) 3a are formed on the front surface side of a semiconductor wafer 6, and in which a back surface electrode 8 and bus electrodes (surface electrodes) 3b are formed on the back surface side, are connected to each other by the wiring members 4. The wiring member 4 has its one end connected to the bus electrode 3a as a surface electrode and the other end connected to the bus electrode 3b as a surface electrode via the conductive adhesive film 10 of the present invention respectively.

In the solar battery module 100 having such a configuration, the surface electrode and the wiring member are connected by the conductive adhesive film in this embodiment described above, so that the solar battery cells are not adversely affected, and sufficient connection reliability can be obtained. Thus, the solar battery module 100 can ensure high F. F. for a long time, due to its excellent connection reliability.

The preferred embodiments of the present invention have been described above, but the present invention is not limited to the above embodiments. Various modifications can be made in the present invention without departing from the gist thereof.

The connection method of the present invention can be preferably used, not only in fabricating the above-described solar battery, but also in fabricating, for example, tantalum capacitors, aluminum electrolytic capacitors, ceramic capacitors, power transistors, various sensors, MEMS-related materials, and lead wiring members for display materials.

EXAMPLES

The present invention will be described below in more detail by examples, but the present invention is not limited to these examples.

Example 1

First, a solar battery cell (manufactured by MOTECH, trade name: "125 Square Multicrystalline Cell MOT T1," 250 μm thick×12.5 cm wide×12.5 cm long) formed by providing surface electrodes (2 mm wide×15 cm long, Rz: 10 μm, Ry: 14 μm) formed of a silver glass paste on the surface of a polycrystalline silicon wafer was prepared.

Next, an acrylic rubber (manufactured by Hitachi Chemical Company, Ltd., trade name: "KS8200H," molecular weight: 850,000) formed by copolymerizing 40 parts by mass of butyl acrylate, 30 parts by mass of ethyl acrylate, 30 parts by mass of acrylonitrile, and 3 parts by mass of glycidyl methacrylate was prepared.

50 g of a phenoxy resin (manufactured by Union Carbide Corporation, trade name: "PKHC," weight average molecular weight: 45000) and 125 g of the above acrylic rubber were dissolved in 400 g of ethyl acetate to obtain a solution having 30% by mass of solids. Then, 325 g of a liquid epoxy resin containing a microcapsule type latent curing agent (manufactured by Asahi Kasei Chemicals Corporation, trade name: "Novacure HX-3941HP," epoxy equivalent: 185 g/eq) was added to the above solution, and the solution was further stirred to obtain a pasty adhesive component.

Next, nickel particles (apparent density: 3.36 g/cm$^3$), which were conductive particles having an average particle diameter of 12 μm, were added and dispersed in the above-described adhesive component. Thus, a pasty conductive adhesive was obtained in which 5% by volume of the conductive particles were mixed, based on the total volume of the adhesive component and the conductive particles. The average particle diameter of the conductive particles was derived by the above-described method through observation by a scanning electron microscope (SEM, manufactured by Hitachi, Ltd., trade name: "S-510"). Also, the mixing amount of the conductive particles was calculated from particle volume, calculated considering the shape of the conductive particle as the shape of a sphere having the average particle diameter as its diameter, and the apparent density of the conductive particles.

The above pasty conductive adhesive was applied on the glossy surface of an electrolytic copper foil, 20 cm wide×30 cm long×175 μm thick, which was a wiring member, using a roll coater (manufactured by TESTER SANGYO CO., LTD., trade name: "PI-1210"), to obtain a coating film. The gap of the roll coater was adjusted so that the thickness after the solvent and the like were volatilized from the coating film, that is, the thickness of the conductive adhesive film, was 25 μm. For this adjustment, three types of films having different film thickness after the removal of the solvent and the like were fabricated, previously changing the gap, and a relation between the gap and the film thickness was derived. The adjustment was performed based on the relation.

Next, the coating film was placed on a hot plate and heated at 70° C. for 3 minutes to volatilize the solvent and the like. Subsequently, the coating film was cut by a slitter (manufactured by TOYO KNIFE CO., LTD., trade name: "High-Precision Gang Unit") to a width of 2 mm to obtain a laminate in which the conductive adhesive film having the conductive particles dispersed therein and having a thickness of 25 μm was provided on the glossy surface of the electrolytic copper foil. This laminate was cut to a length of 20 cm into a rectangle 2 mm wide×20 cm long.

Then, the laminate and the above solar battery cell were laminated so that the surface of the conductive adhesive film opposite to the electrolytic copper foil side and the surface of the surface electrode of the above solar battery cell were in contact with each other to obtain a laminate. Then, heating and pressurization were performed on the laminate in the direction of lamination, using a pressure bonding tool (manufactured by Nikka Equipment & Engineering Co., Ltd., trade name: "AC-S300"), under conditions of a heating temperature of 170° C., a pressurization pressure of 2 MPa, and a heating and pressurization time of 20 seconds. Thus, a connection structure was obtained in which the wiring member of the electrolytic copper foil was connected to the surface electrode of the solar battery cell via the conductive adhesive film.

Example 2

A connection structure was obtained as in Example 1, except that a copper-plated film (copper plating thickness: 40 μm) in which copper plating was provided on the major surface of a resin film, an insulating film, was substituted for the electrolytic copper foil.

Example 3

A connection structure was obtained as in Example 1, except that gold-plated plastic particles (average particle diameter: 20 μm, gold plating thickness: 200 Å on average, apparent density: 2.8 g/cm$^3$) formed by covering the surface of plastic particles with gold plating were substituted for the nickel particles, and that a solar battery cell (manufactured by MOTECH, trade name: "125 Square Multicrystalline Cell MOT T1," 250 μm thick×12.5 cm wide×12.5 cm long) formed by providing surface electrodes having a surface roughness Rz of 15 μm and a surface roughness Ry of 18 μm and being formed of a silver glass paste was substituted for the solar battery cell formed by providing the surface electrodes having a surface roughness Rz of 10 μm and a surface roughness Ry of 14 μm and being formed of a silver glass paste.

Comparative Example 1

First, a solar battery cell similar to that of Example 1 was prepared. Next, solder-plated copper wire (2 mm wide×250 μm thick) was prepared, and the electrode of the above solar battery cell and the solder-plated copper wire were connected by solder. Thus, a connection structure was obtained.

Comparative Examples 2 and 3

A connection structure was obtained as in Example 1, except that the average particle diameter of the conductive particles was changed as described in Table 4.

Comparative Example 4

A connection structure was obtained as in Example 1, except that the thickness of the conductive adhesive film was changed as described in Table 6.

The formulation of the substances in the adhesive component according to the examples and the comparative examples is shown in Tables 1 and 2. The types of the conductive particles and the wiring member are shown in Tables 3 and 4. The surface roughness of the surface electrode, and the type of the conductive adhesive film are shown in Tables 5 and 6. The thickness of the conductive adhesive film, and the surface roughness of the surface electrode were measured as follows. Also, the elastic modulus (storage modulus) of the conductive adhesive film was measured as described above.

[Measurement of Thickness of Conductive Adhesive Film]

The thickness of the conductive adhesive film was measured by a micrometer (manufactured by Mitutoyo Corp., trade name: "ID-C112C").

[Measurement of Surface Roughness of Surface Electrode]

The ten point height of roughness profile Rz and maximum height Ry of the surface electrode were derived according to JIS-B0604-1994. The electrode surface was observed by an ultra-depth shape measurement microscope (manufactured by KEYENCE, trade name: "VK-8510"), and Rz and Ry were derived by image measurement and analysis software (manufactured by KEYENCE, trade name: "VK-H1A7."

TABLE 1

|  | Phenoxy resin (g) | Acrylic rubber (g) | Ethyl acetate (g) | Epoxy resin (g) |
|---|---|---|---|---|
| Example 1 | 50 | 125 | 400 | 325 |
| Example 2 | 50 | 125 | 400 | 325 |
| Example 3 | 50 | 125 | 400 | 325 |

TABLE 2

|  | Phenoxy resin (g) | Acrylic rubber (g) | Ethyl acetate (g) | Epoxy resin (g) |
|---|---|---|---|---|
| Comparative Example 1 | — | — | — | — |
| Comparative Example 2 | 50 | 125 | 400 | 325 |
| Comparative Example 3 | 50 | 125 | 400 | 325 |
| Comparative Example 4 | 50 | 125 | 400 | 325 |

TABLE 3

| | Conductive particles | | | Wiring member | |
|---|---|---|---|---|---|
| | Mixing amount (% by volume) | Average particle diameter (μm) | Material | Thickness (μm) | Material |
| Example 1 | 5 | 12 | nickel | 175 | electrolytic copper foil |
| Example 2 | 5 | 12 | nickel | 40 | copper-plated film |
| Example 3 | 5 | 20 | gold + plastic | 175 | electrolytic copper foil |

TABLE 4

| | Conductive particles | | | Wiring member | |
|---|---|---|---|---|---|
| | Mixing amount (% by volume) | Average particle diameter (μm) | Material | Thickness (μm) | Material |
| Comparative Example 1 | — | — | — | — | — |
| Comparative Example 2 | 5 | 3 | nickel | 175 | electrolytic copper foil |
| Comparative Example 3 | 5 | 5 | nickel | 175 | electrolytic copper foil |
| Comparative Example 4 | 5 | 12 | nickel | 175 | electrolytic copper foil |

TABLE 5

| | Surface roughness (μm) | | conductive adhesive film | |
|---|---|---|---|---|
| | Ten-point average roughness Rz | Maximum height Ry | Thickness (μm) | Elastic modulus (GPa) |
| Example 1 | 10 | 14 | 25 | 2.1 |
| Example 2 | 10 | 14 | 25 | 2.1 |
| Example 3 | 15 | 18 | 35 | 2.1 |

TABLE 6

| | Surface roughness (μm) | | Conductive adhesive film | |
|---|---|---|---|---|
| | Ten-point average roughness Rz | Maximum height Ry | Thickness (μm) | Elastic modulus (GPa) |
| Comparative Example 1 | 10 | 14 | — | — |
| Comparative Example 2 | 10 | 14 | 25 | 2.1 |
| Comparative Example 3 | 10 | 14 | 25 | 2.1 |
| Comparative Example 4 | 10 | 14 | 8 | 2.1 |

<Evaluation of Properties>

For the connection structures in the above Examples 1 to 3 and Comparative Examples 1 to 4, peel strength, the warp of the wafer (substrate), F. F. (1000 h)/F. F. (0 h), and the yield of the solar battery cell were measured as follows. The results are shown in Tables 7 and 8.

[Measurement of Peel Strength]

An end of the tab electrode (electrolytic copper foil or copper-plated film) in the obtained connection structure was perpendicularly folded, and fixed in the chuck in a peel strength measurement apparatus (manufactured by ORIENTEC, trade name: "STA-1150"). Subsequently, the tab electrode was pulled up at a pulling speed of 2 cm/second to measure peel strength. "Wafer fracture" in the tables means that due to high peel strength, the wafer fractured before the tab electrode was completely peeled (released), so that the peel strength could not be measured.

[Measurement of Warp of Wafer]

The obtained connection structure was placed on a smooth surface, with the wafer being on the lower side, and one end (one side) of the rectangular wafer was fixed on the smooth surface. The surface of the wafer opposite to the electrode side was convex, so that when one end of the rectangular wafer was fixed on the smooth surface, one end opposed to the end was lifted. The distance between the lifted one end and the smooth surface was measured at five points using a focal depth meter, and the arithmetic mean value was calculated. The ratio (%) of the above arithmetic mean value to the length of one side of the wafer was derived as the warp amount. The measurement lower limit value was 0.3%, so that a value less than 0.3% was shown as "<0.3" in the tables.

[Measurement of F. F. (1000 h)/F. F. (0 h)]

The IV curve of the obtained connection structure was measured using a solar simulator (manufactured by WACOM ELECTRIC CO., LTD., trade name: "WXS-155S-10," AM: 1.5 G). Also, the connection structure was allowed to stand still in a high temperature and high humidity atmosphere of 85° C. and 85% RH for 1000 hours, and then, the IV curve was similarly measured. F. F. was derived from each of the IV curves, and F. F. (1000 h)/F. F. (0 h), which was F. F., after still standing in the high temperature and high humidity atmosphere, divided by F. F., before still standing under the high temperature and high humidity conditions, was used as the evaluation index. Generally, when the value of F. F. (1000 h)/F. F. (0 h) is 0.95 or less, the connection reliability is determined to be low.

[Measurement of Yield of Solar Battery Cell]

First, ten connection structures were fabricated. The state of each connection structure was observed, and the number of the connection structures excluding those in which fracture or release was seen, among the ten connection structures, was evaluated as the yield (%).

TABLE 7

| | Peel strength (MPa) | Wafer warp (%) | ΔF.F.(1000 h)/ ΔF.F.(0 h) | Cell yield (%) |
|---|---|---|---|---|
| Example 1 | wafer fracture | <0.3 | 0.957 | 100 |
| Example 2 | wafer fracture | <0.3 | 0.957 | 100 |
| Example 3 | wafer fracture | <0.3 | 0.957 | 100 |

TABLE 8

| | Peel strength (MPa) | Wafer warp (%) | ΔF.F.(1000 h)/ ΔF.F.(0 h) | Cell yield (%) |
|---|---|---|---|---|
| Comparative Example 1 | wafer fracture | 3.0 | 0.957 | 60 |
| Comparative Example 2 | wafer fracture | <0.3 | 0.642 | 100 |
| Comparative Example 3 | wafer fracture | <0.3 | 0.885 | 100 |
| Comparative Example 4 | 200 | <0.3 | 0.642 | 20 |

INDUSTRIAL APPLICABILITY

The present invention can provide a method for connecting a surface electrode of a solar battery cell and a wiring member that uses a connection member, which is an alternative to solder, and provides sufficiently excellent connection reliability.

The invention claimed is:

1. A method for electrically connecting a surface electrode of a solar battery cell and a wiring member via a conductive adhesive film, wherein the method comprises the steps of:
   (a) providing the conductive adhesive film comprising an insulating adhesive and conductive particles, the conductive adhesive film having a thickness t; and
   (b) connecting the surface electrode of the solar battery cell and the wiring member via the conducting adhesive film, wherein a ten point height of roughness profile and maximum height of a surface of the surface electrode connected with the conductive adhesive film are Rz and Ry, respectively, and an average particle diameter r of the conductive particles is greater than the ten point height of roughness profile Rz, and a difference between the average particle diameter r and the ten point height of roughness profile Rz, r−Rz, is greater than or equal to 1 μm, and r−Rz is less than or equal to Rz,
   wherein the surface electrode of the solar battery cell is a surface electrode formed using silver glass paste,
   wherein the film thickness t is greater than the maximum height Ry by 1 μm or more,
   wherein the surface electrode is an electrode provided on a surface of one or more wafers selected from the group consisting of a monocrystalline silicon wafer, and a polycrystalline silicon wafer, and wherein the ten point average surface roughness Rz of the surface electrodes is at least 10 μm, and a maximum height Ry of the surface electrodes is at least 14 μm.

2. The connection method according to claim 1, wherein the wiring member is a film conductive member.

3. The connection method according to claim 1, wherein the wiring member comprises, as a main component, one or more metals selected from the group consisting of Cu, Ag, Au, Fe, Ni, Pb, Zn, Co, Ti, and Mg.

4. The connection method according to claim 1, wherein the average particle diameter r is 3 to 30 μm.

5. The connection method according to claim 1, wherein a difference between the film thickness t and the maximum height Ry is 20 μm or less.

6. A solar battery module having a structure in which a plurality of solar battery cells, each having a surface electrode, are connected via a wiring member electrically connected to each surface electrode, comprising:
   a conductive adhesive film, wherein the conductive adhesive film comprises:
   (a) an insulating adhesive; and
   (b) conductive particles, wherein a ten point height of roughness profile and maximum height of a surface of the surface electrode in contact with the conductive adhesive film are Rz and Ry, respectively, and an average particle diameter r of the conductive particles is greater than the ten point height of roughness profile Rz, and a difference between the average particle diameter r and the ten point height of roughness profile Rz, r−Rz, is greater than or equal to 1 μm and r−Rz is less than or equal to Rz, and a thickness t of the conductive adhesive film is greater than the maximum height Ry by 1 μm or more, wherein the surface electrode of the solar battery cell is a surface electrode formed using silver glass paste,
   wherein each surface electrode and the wiring member are connected by the conductive adhesive film, and wherein the ten point average surface roughness Rz of the surface electrodes is at least 10 μm, and a maximum height Ry of the surface electrodes is at least 14 μm.

7. The solar battery module according to claim 6, wherein the wiring member is a film conductive member.

8. The solar battery module according to claim 6, wherein the wiring member comprises, as a main component, one or more metals selected from the group consisting of Cu, Ag, Au, Fe, Ni, Pb, Zn, Co, Ti, and Mg.

9. The solar battery module according to claim 6, wherein the average particle diameter r is 3 to 30 μm.

10. The solar battery module according to claim 6, wherein a difference between the film thickness t and the maximum height Ry is 20 μm or less.

11. A method for electrically connecting a surface electrode of a solar battery cell and a wiring member via a conductive adhesive film, wherein the method comprises the steps of:
   (a) providing the conductive adhesive film comprising an insulating adhesive and conductive particles, the conductive adhesive film having a thickness t;
   (b) connecting the surface electrode of the solar battery cell and the wiring member via the conducting adhesive film, wherein a ten point height of roughness profile and maximum height of a surface of the surface electrode connected with the conductive adhesive film are Rz and Ry, respectively, and an average particle diameter r of the conductive particles is greater than the ten point height of roughness profile Rz, and a difference between the average particle diameter r and the ten point height of roughness profile Rz, r−Rz, is greater than or equal to 1 μm and r−Rz is less than or equal to Rz, wherein the thickness t is greater than the average particle diameter r, and wherein the film thickness t is greater than the maximum height Ry by 1 μm or more, and wherein the ten point average surface roughness Rz of the surface electrodes is at least 10 μm, and a maximum height Ry of the surface electrodes is at least 14 μm.

12. A method for electrically connecting a surface electrode of a solar battery cell and a wiring member via a conductive adhesive film, wherein the method comprises the steps of:
- (a) providing the conductive adhesive film comprising an insulating adhesive and conductive particles;
- (b) connecting the surface electrode of the solar battery cell and the wiring member via the conducting adhesive film, wherein the surface of the surface electrode has a roughness profile, the roughness profile having a ten point height Rz (μm), a maximum height Ry ((μm) and a thickness t (μm), wherein the conductive parties have an average diameter r (μm), wherein r and Rz have a relationship: $1\ \mu m \leq (r-Rz) \leq Rz$, wherein t is equal to or greater than (Ry+1 μm), wherein the ratio between r and (Ry−Rz) has the relationship: $3.0 \leq r/(Ry-Rz) \leq 6.6$, wherein the surface electrode of the solar battery cell is a surface electrode formed using silver glass paste, and wherein the ten point average surface roughness Rz of the surface electrodes is at least 10 μm, and a maximum height Ry of the surface electrodes is at least 14 μm.

* * * * *